United States Patent [19]
Park et al.

[11] Patent Number: 5,982,223
[45] Date of Patent: Nov. 9, 1999

[54] CHARGE PUMP SYSTEM WITH IMPROVED PROGRAMMING CURRENT DISTRIBUTION

[75] Inventors: Eung Joon Park; Hsi-Hsien Hung, both of Fremont, Calif.

[73] Assignee: Integrated Silicon Solution, Inc., Santa Clara, Calif.

[21] Appl. No.: 08/879,340

[22] Filed: Jun. 20, 1997

[51] Int. Cl.[6] ...................................................... H03L 1/00
[52] U.S. Cl. ............................................. 327/536; 363/60
[58] Field of Search ................................. 327/390, 536; 363/59, 60; 307/110

[56] References Cited

U.S. PATENT DOCUMENTS 5,734,290  3/1998  Chang et al. .......................... 327/536
5,818,289  10/1998  Chevallier et al. ..................... 327/536

*Primary Examiner*—Kenneth B. Wells
*Attorney, Agent, or Firm*—Pennie & Edmonds LLP

[57] ABSTRACT

A voltage pump circuit includes a native MOS device coupled as a charge transfer device (M1) between input and output stage nodes. A parallel-coupled MOS pair (M2, M3) is coupled between drain (input node) and source (output node) of the charge transfer device, in which M3 is configured as a diode. A clock generator outputs at least three non-overlapping phase signals: $\phi1$ (which goes high at t1 and low at t6), $\phi2$ (which goes high at t3 and low at t4), $\phi3$ (which goes low qt t2 and high at t5). The t1 $\phi1$ positive transient is AC-coupled to M1's drain, and a smaller fraction of the transient is coupled to M1's gate, precharging M1, which begins to turn-on. The $\phi3$ t2 negative transient is AC-coupled to M1's source, increasing M1 gate-source potential, which more fully turns-on M1. The $\phi2$ t3 positive transient is coupled to M1's gate, turning-on M1 very hard. A phase clock generator outputting square-wave, same-frequency signals having respective 90° phase shifts that are frequency independent can be used to drive pump circuits and sequentially operated groups of pump circuits.

11 Claims, 8 Drawing Sheets

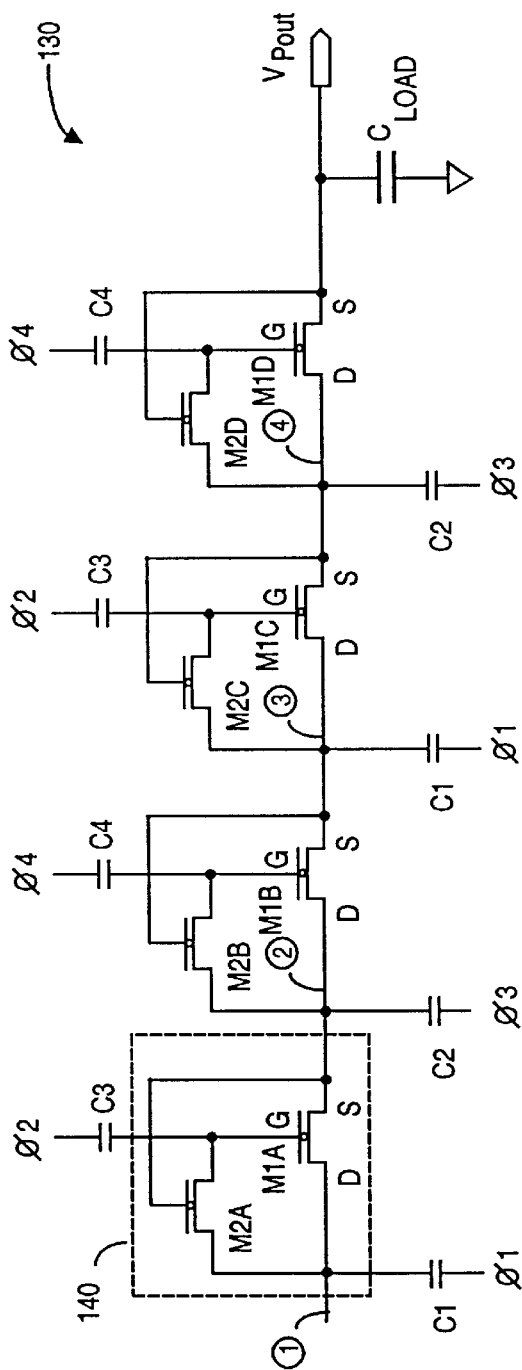
FIGURE 3A (PRIOR ART)
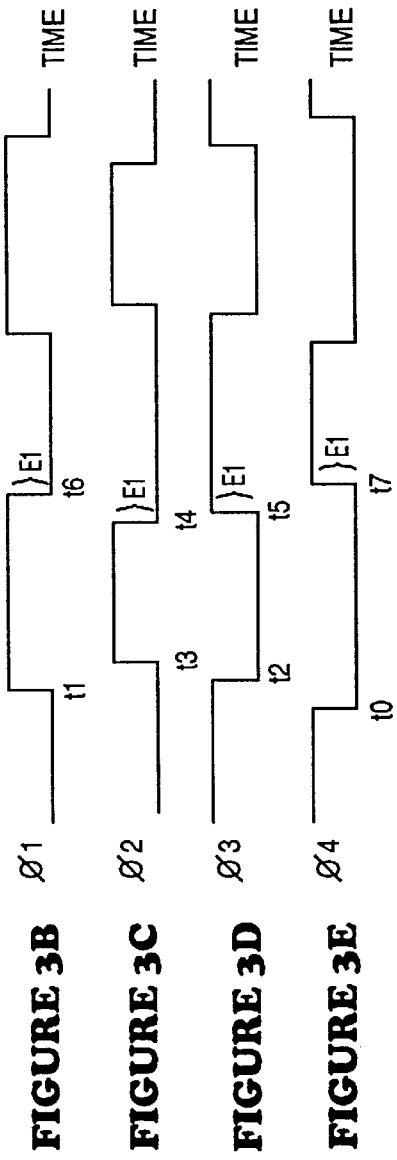
FIGURE 3B
FIGURE 3C
FIGURE 3D
FIGURE 3E

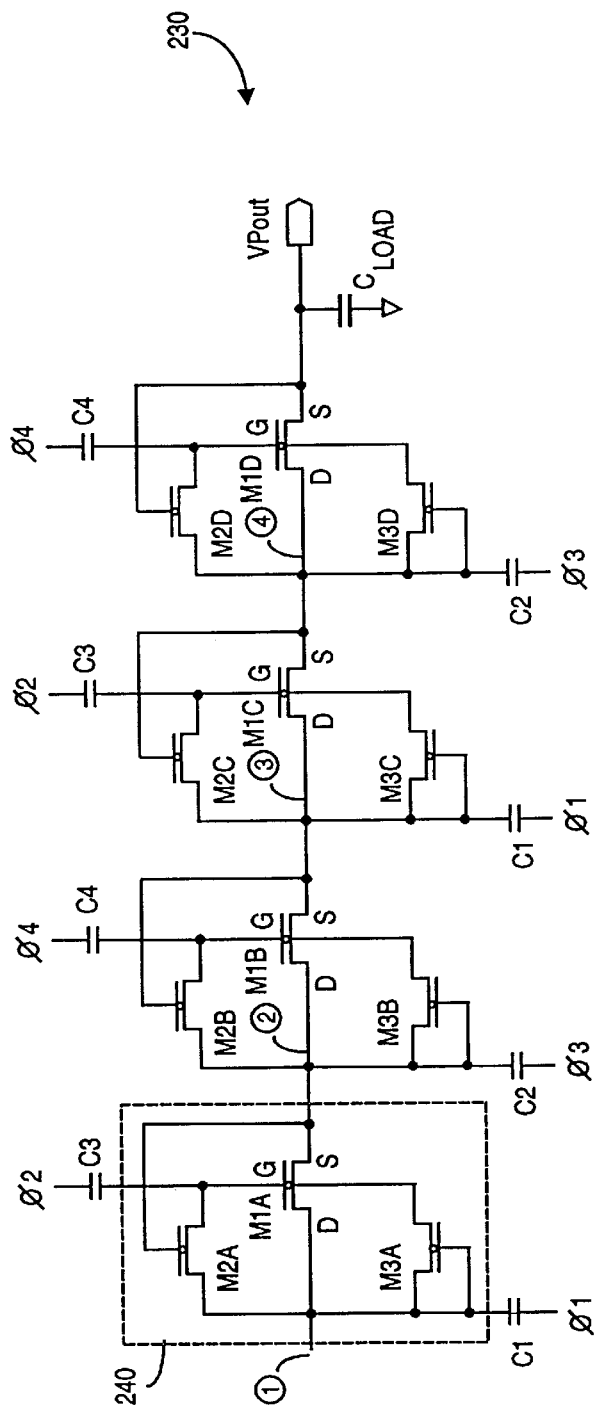
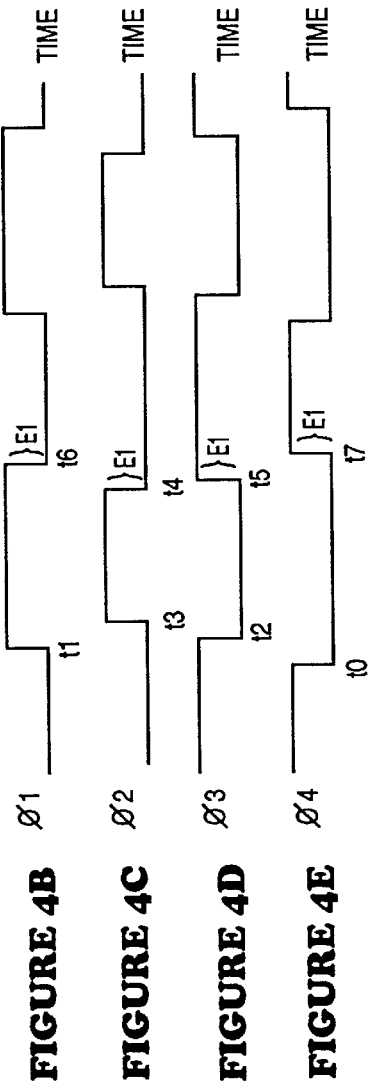
FIGURE 4A
FIGURE 4B
FIGURE 4C
FIGURE 4D
FIGURE 4E

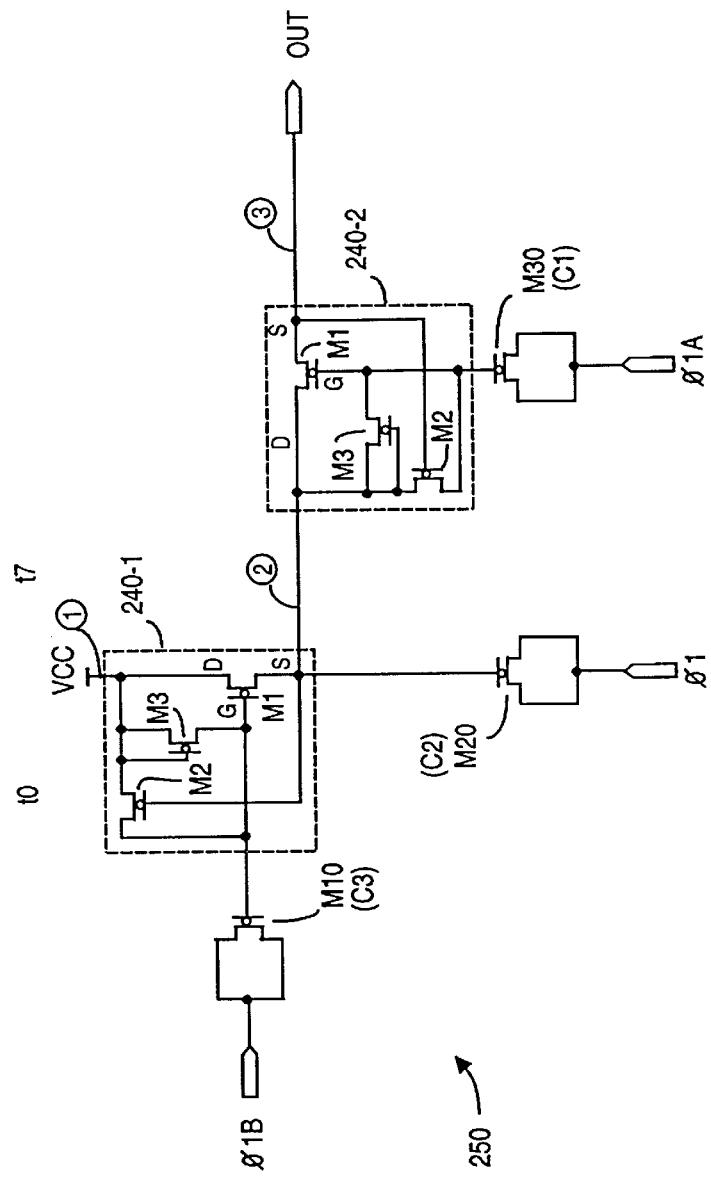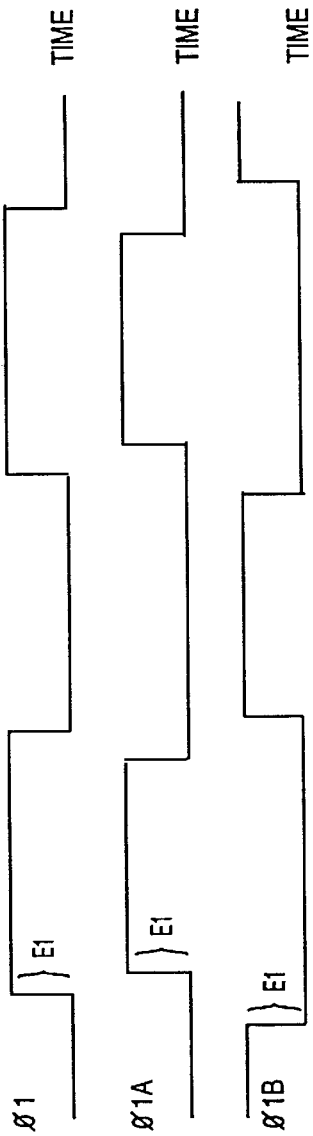
FIGURE 5A
FIGURE 5B
FIGURE 5C
FIGURE 5D

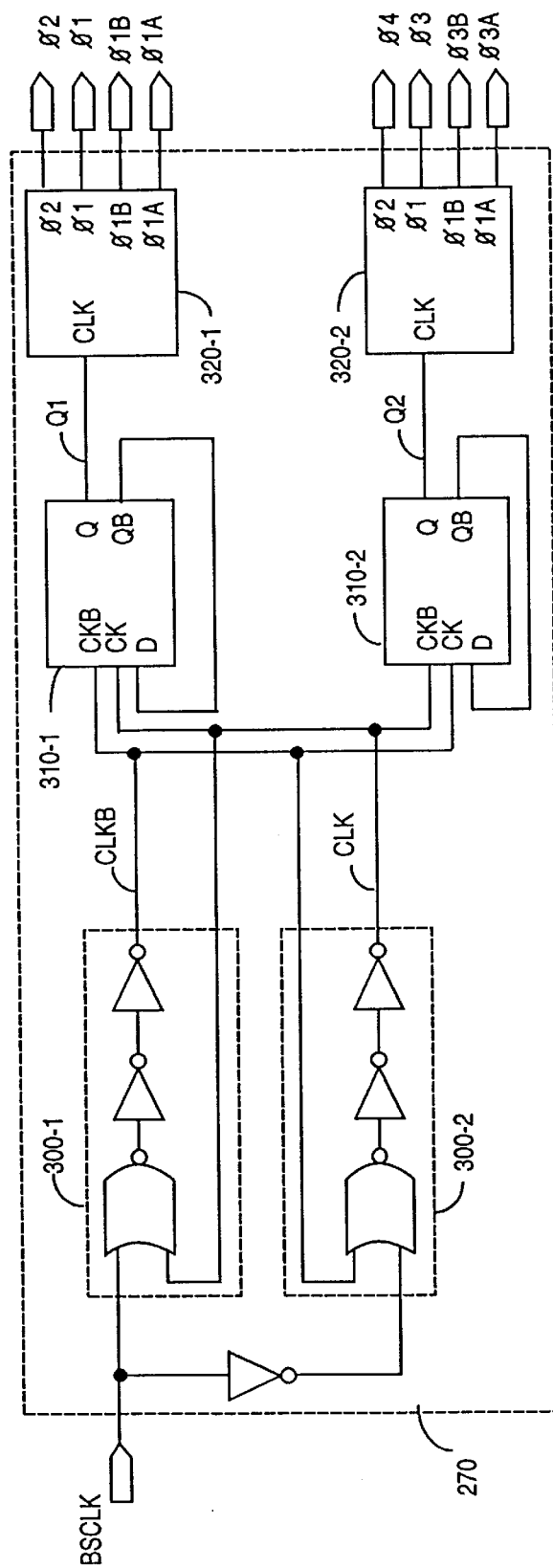
FIGURE 7A
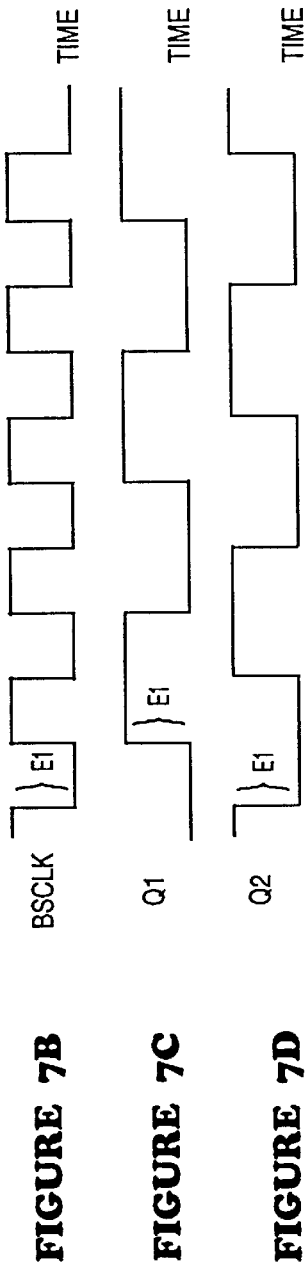
FIGURE 7B
FIGURE 7C
FIGURE 7D

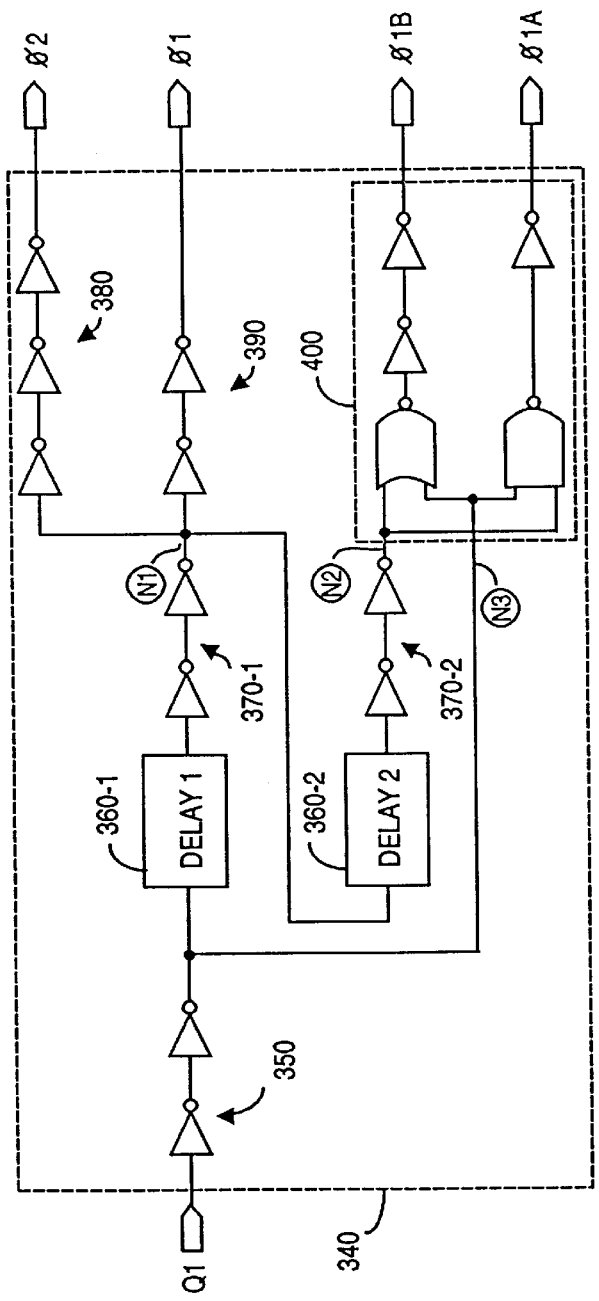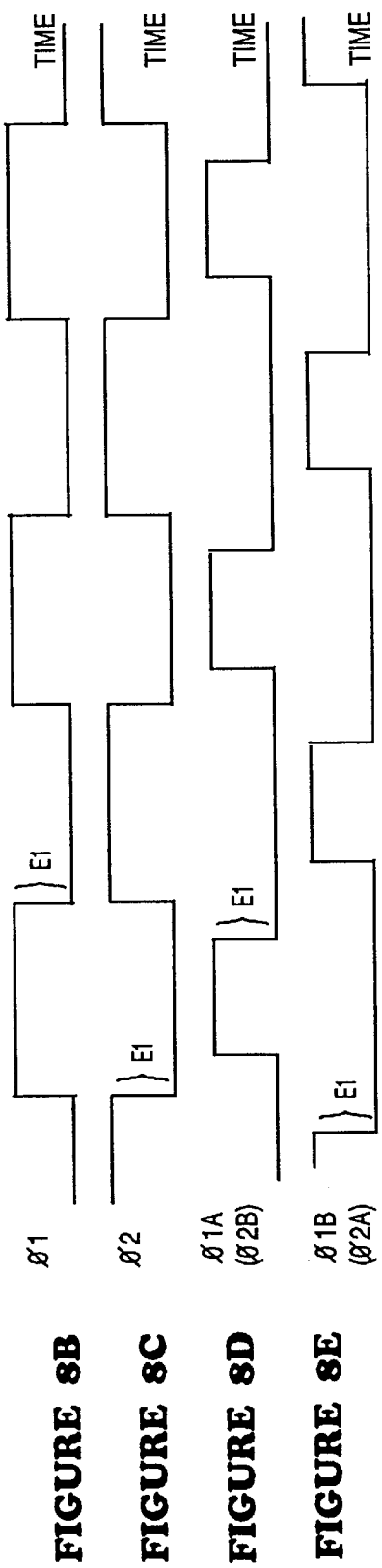
FIGURE 8A
FIGURE 8B
FIGURE 8C
FIGURE 8D
FIGURE 8E

CHARGE PUMP SYSTEM WITH IMPROVED PROGRAMMING CURRENT DISTRIBUTION

FIELD OF THE INVENTION

The present invention relates to charge pump systems that step-up voltage levels used to program flash EPROM and EEPROM memory circuits, and more specifically to such systems having improved output efficiency and improved current distribution characteristics.

BACKGROUND OF THE INVENTION

Flash electrically programmable read only memories ("EPROMs") and flash electrically erasable and programmable read only memories ("EEPROMs") are solid state devices that can persistently store digital data. As shown by FIG. 1, an NMOS EPROM-type flash cell 10 typically has a metal-oxide-silicon ("MOS") semiconductor structure that includes an N-type source region 20 and an N-type drain region 30 formed on a typically P-type substrate (not shown), a floating gate 40 and a control gate 50. In a manner known to those skilled in the art, floating gate 40 is formed overlying a MOS channel region in the NMOS device substrate, but separated therefrom by a thin oxide layer. The control gate 50 is formed overlying the floating gate. In practice, the NMOS device substrate (or bulk) is coupled to a source of potential Vbb that typically is ground. (Of course a PMOS cell could be implemented by inter-changing P-type and N-type regions and substrate.) Although a flash-type EPROM cell has been described, high voltage generation according to the present invention may also be used with EPROM, or EEPROM type memory cells.

A Vcg voltage coupled to control gate 50 can affect charge stored on floating gate 40, which charge affects the Vt threshold voltage of MOS device 10. The magnitude and type of charge on the floating gate controls the minimum (or Vt) voltage Vcg that will turn-on device 10, causing drain-source current to flow across the channel region 20. (For example, if an erase operation were to drive too many electrons from the floating gate, too many holes would remain, depressing Vt below the memory cell's intrinsic value of Vt.) Device 10 is programmed to one of two states by accelerating electrons from the substrate channel region through the thin gate oxide layer onto floating gate 40. The state of device 10, e.g., how much charge is stored on floating gate 40, is read by coupling an operating voltage Vgs across source and drain regions 20, 30 and then reading the drain-source current Ids to determine whether the device is ON or OFF for a given control voltage level Vcg.

Hot electron injection is used to program a flash EPROM, but typically is impractical for erasing. Erasing is commonly done in blocks of cells, and would require relatively high current to be carried out using hot electron injection. During programming, it is necessary to apply a positive high voltage Vcg, e.g., perhaps +10 VDC to control gate 50, while applying perhaps +5 VDC to drain 30, and 0 VDC to source 20. As hot electrons are accelerated and travel from source to drain, the electric field created by the high Vgs and Vds voltages can pull some hot electrons from the drain to the floating gate. On the other hand, to erase a flash EPROM (or to program a flash EEPROM), it is necessary to apply a negative high voltage Vcg, e.g., perhaps −10 VDC, and a positive Vs or perhaps +5 VDC, while allowing Vd to float. The negative Vcg high voltage and Vs produce a large tunnel electric field that can push electrons from the floating gate 40 to the source 20.

Typically the circuitry with which memory cells 10 are used is powered by a single low voltage power supply, a 3.3 VDC battery for example, although lower or high voltage batteries may instead be used. Positive and negative high voltage pump circuits are commonly used to generate the ±10 V or so high voltage necessary to program and erase memory cells from a single lower voltage power supply. As will be described, the present invention is directed to providing positive high voltage using pump circuitry.

As shown in FIG. 2, it is common to form an integrated circuit ("IC") 100 that includes a plurality of cells 10 that are arrayed in addressable rows and columns that define a storage array 110. Address logic 120 permits accessing a specific cell in such an array. For example, during a program/read or erase operation, a given cell 10 may be accessed by applying the proper Vgs, Vd, Vs potentials via bit lines to all cells in a column containing the addressed cell, and via row lines to the row containing the addressed cell. For ease of illustration, address logic 120 is shown as having a single output lead, but in practice there will be multiple output leads, including leads for Vgs, Vd, and Vs.

As shown in FIG. 2, IC 100 (e.g., the circuitry thereon) preferably operates from a single low voltage power supply Vcc, which may be a battery especially if, for example, IC 100 is a storage unit within a laptop computer. Typically the low voltage power supply magnitude is 5 VDC or 3.3 VDC, although even lower voltages will be used in the future.

To generate the high voltage necessary to program or erase the various cells, IC 100 will include a positive high voltage pump circuit 130 that outputs a high positive potential VPout, and a negative high voltage pump circuit 140 that outputs a high negative potential VPout. IC 100 also includes a phase or clock generator circuit 150 that outputs a plurality of non-overlapping different phase pulse trains that drive the positive and negative pump circuits. High voltage pump circuits typically require two, and more commonly at least three-phase non-overlapping output pulse trains, e.g., φ1, φ2, and φ3 in FIG. 2. By non-overlapping it is meant that 0-to-1, and 1-to-0 voltage transitions of one phase pulse train should never overlap (e.g., coincide) with transitions of another phase pulse train.

In practice, positive high voltage circuit 130 may experience high current loading peaks when delivering high programming voltage to relevant bit lines. Adequately maintaining sufficient programming current while delivering the necessary high voltage presents a substantial challenge to circuit and device designers. One approach is to utilize larger-sized MOS devices and/or to parallel-couple the high voltage output from a plurality of high voltage pumps. However, such approaches tend to complicate the circuit design, and to require more IC chip surface area.

FIG. 3A shows a four-phase prior art four-stage positive high voltage charge pump circuit 130 such as might be used for circuit 130. In practice, however, high voltage generator 130 might include a number of such circuits whose VPout output nodes are coupled in parallel. Each circuit is termed four-phase because four drive non-overlapping clock signals, φ1, φ2, φ3, φ4, are used, as depicted in FIGS. 3B, 3C, 3D and 3E. Each circuit in FIG. 3A has four stages 140 that are series-coupled to provide the output voltage VPout. The magnitude of VPout will exceed the Vcc or E1 magnitude otherwise present in circuit 130. If outputs from multiple pump circuits 130 are parallel-coupled together, their drive clock signals must be properly sequenced to assure reasonable current distribution among the circuits.

In its simplest form, pump circuit 130 typically comprises native (e.g., very low threshold Vt) NMOS series-coupled charge transfer transistors M1A, M1B, etc., and associated AC-coupling capacitors C1, C2, C3, C4 (typically each a few pF), driven by clock signals φ1, φ2, φ3, φ4. It is the purpose of circuit 130 to increase (or pump-up) the voltage seen at node 1 successively by an AC-coupled magnitude that is proportional to magnitude E1 of the clock pulses, 3.3 V perhaps. It is the function of additional (preferably native) transistors M2 to decrease the Vt voltage drop from drain-to-source across each transistor M1.

Assume at first that devices M2A, M2B, etc. are removed, and that the gate and drain source leads of each device M1A, M1B, etc. are coupled together. (It is assumed that the source and drain regions of the various MOS devices disclosed in this application are in fact interchangeable.) The resultant configuration is analogous to series of PN diodes, in which node 1 is the anode lead and VPout the cathode lead.

Consider operation of the first transistor stage in the somewhat simplistic model under consideration. At time t1, a substantial fraction of the 0-to-1 transition (e.g., about E1 volts) of φ1 would AC-couple through capacitor C1 and elevate the potential at node 1. Node 1 would not receive 100% of the E1 transition, as there would be a voltage divider attenuation proportional to a ratio between C1 and the smaller magnitude equivalent shunt capacitance at node 1. But at 0 V gate-drain on M1A, there would be a Vt threshold voltage loss from drain to source across M1A, which would diminish the magnitude of the voltage increase (e.g., the charge transfer) seen at node 2. In similar fashion, the next series-coupled M1B transistor would AC-couple the 0-to-1 transition of φ3 to node 3 at time t5, elevating potential at node 3, but again suffering a Vt loss in the transfer of charge from node 2 to node 3.

Consider now the actual circuit 130 and the Vt cancellation function provided by transistors M2A, M2B, etc., whereby more voltage is transferred from drain to source across each coupling device M1A, M1B, etc. Reference is now made to the clock timing diagrams shown in FIGS. 3B–3E.

At time t0, φ4 transitions 1-to-0, coupling a negative voltage transient whose magnitude approaches E1 though capacitor C4 to the gate of devices M1B, M1D. These gate potentials are depressed down to a Vt below their respective source potentials, and M1B, M1D are turned-off. The off states of M1B, M1D will prevent backward charge flow (leftward direction charge flow, in FIG. 3A) when φ1 transitions 0-to-1.

At time t1, φ3 is high and the 0-to-1 φ1 state change begins a set-up transition that AC-couples a voltage transient approaching E1 through C1 to node 1 (and similarly to node 3). As a result, the quiescent M1A, M1C drain potentials elevate by about E1 volts. The gate nodes of M1A, M1C will each be at a potential of up to about Vt below their respective source nodes, e.g., nodes 2 and 4, and are thus off. Because M1A is presently turned-off, no charge transfers across M1A from node 1 to node 2, and because M1C is turned-off, no charge transfers across M1C from node 3 to node 4. Node 3, e.g., the gate node of M2B, is elevated positively by the t1 transient, which turns-on M2B. With M2B turned-on, M1B in the second pump stage remains off, as there is insufficient Vgs to turn-on. In the fourth pump stage, M1D also remains turned-off.

At time t2, the 1-to-0 transition of φ3 AC couples through C2 to depress potential at nodes 2 and 4. The gate potentials of M2A, M2C decrease, which turns-off devices M2A, M2C, leaving gate potentials of M1A, M1C unchanged. Assume that the negative-going time t2 φ3 transition brings nodes 2 and 4 below Vt less than the gate potential of M1A, M1C. Devices M1A, M1C begin to turn-on, and charge transfer can now start from node 1 to node 2 in the first pump stage, and from node 3 to node 4 in the third pump stage.

At time t3, φ2 transitions 0-to-1, AC-coupling a positive-going transient through capacitors C3 into the gates of devices M1A, M1C. These gate potentials elevate and devices M1A, M1C are turned-on even harder, to provide a more efficient charge transfer from nodes 1 to 2, and from nodes 3 to 4.

At time t4, φ2 transitions 1-to-0, AC-coupling a negative-going transient through capacitors C3 into the gates of M1A, M1C. Devices M1A, M1C turn-off, thus preventing any backward flow of charge (e.g., leftward in FIG. 3A) when φ3 transitions 0-to-1 at time t5.

During the transitions at times t5, t6, t7, the above-described charge transfer continues, except charge is transferred from node 2 to node 3, and from node 4 to Vpout.

Series-coupling several pump circuits 140 can further elevate the output potential from circuit 130. As noted in FIGS. 3C and 3E, gate clock signals φ2, φ4 to adjacent stages are substantially out of phase with each other.

In circuits operating with Vcc<5 VDC or so, more than four pumping stages may be required to ensure outputting a sufficiently high magnitude VPout voltage. However, providing additional pumping stages and associated capacitors requires additional IC chip area that might otherwise be available for fabricating still more memory cells in array 130. Thus, it is important to transfer charge or voltage efficiently within individual pumping stages. As noted, the prior art circuit of FIG. 3A does not begin to really effectively transfer charge until time t3. Further, charge transfer efficiency is degraded by an inability to elevate gate potential at devices M1A, M1B, etc. sufficiently beyond associated source potentials.

Understandably it can be difficult to deliver sufficient magnitude VPout at required load current levels, while preserving the area on IC 100 required by high voltage generator circuitry 130 and its phase generator 150. As noted, it is possible to increase the available load current (i) provided to Cload, e.g., i=$C_{load}$δVPout/δt, by summing together (e.g., parallel-coupling) the VPout output nodes from multiple circuits 130. However, ensuring a reasonable distribution of current among the individual circuits 130 can be challenging, and it is necessary to ensure properly timed sequential clock signals to the various circuits. In the prior art, such sequential timing is commonly achieved using fixed time delay circuits.

While this approach can work at a fixed master clock frequency, frequency variations can skew the sequence of clock signals, due to the non-varying fixed delays. The result can be that some circuits 130 are forced to deliver more load current than other circuits. It is important therefore to ensure proper device operation to avoid over-stressing MOS devices in any heavier-current circuits. Further, non-uniformity of supply current can result in the magnitude of VPout falling low enough to degrade memory array programming efficiency.

In summary, what is needed is a voltage pump circuit, e.g., to replace circuit 130, that can efficiently and reliably boost low voltage Vcc to high positive voltage, using fewer charge pump stages. Preferably such circuit should be implemented in a relatively small IC chip area, and should output $V_{Pout}$ reliably at required load current values, despite varying current demands imposed by storage array 110. Further, such circuit should lend itself to parallel output coupling, while promoting good current distribution among the individual circuits.

The present invention provides such a high voltage charge pump circuit.

SUMMARY OF THE PRESENT INVENTION

In a first aspect, the present invention provides a more efficient voltage pump stage circuit for elevating DC potential between an input node and an output node. A preferred embodiment includes a plurality of pump stages, each stage including a charge transfer MOS device (M1A) whose drain and source leads (or first and second output leads) are coupled respectively between the input and output nodes. Each stage further includes first and second auxiliary MOS devices (M2A, M3A) that are used to cancel Vt voltage drop and elevate M1A gate potential. The first auxiliary device M3A is coupled as a diode between the stage input node and the gate lead of M1A. The second auxiliary device M2A has its source and drain leads coupled in parallel with source and drain leads of M1A, and has its gate lead coupled to the stage output node.

The circuit is preferably driven by four non-overlapping AC-coupled clock phase signals, φ1, φ2, φ3, φ4, each have amplitude E1 volts. In a four stage configuration, at stages one and three φ1 is AC-coupled to the input node and φ2 is AC-coupled to the gate lead of the charge transfer device. At stages two and four, φ3 is AC-coupled to the input node (or output node of stages one and three), and φ4 is AC-coupled to the gate lead of the charge transfer device. At time t0 φ4 transitions 1-to-0, at time t1 φ1 transitions 0-to-1, at time t2 φ3 transitions 1-to-0, and at time t3 φ2 transitions 0-to-1. At time t4 φ2 transitions 1-to-0, at time t5 φ3 transitions 0-to-1, at time t6 φ1 transitions 1-to-0, and at time t7 φ4 transitions 0-to-1.

At t0, the negative φ4 transition coupled to the gates of the second and fourth stage transfer devices turns these devices off, which blocks any backward charge flow toward an earlier stage in the overall circuit. At setup time t1, the positive φ1 transition elevates drain nodes of the charge transfer device in stages one and three, and elevates or pre-boosts gate potential of these same devices by about (E1-Vt) volts. Thus, as early as time t1, the first and third charge transfer devices can begin to turn-on to transfer charge. (The second and fourth stage charge transfer devices become similarly precharged at time t5.) In contrast to prior art configurations, at time t1 the pre-boosted gate potential is not source-limited. As a result, higher charge transfer efficiency is achieved, with diminished Vt voltage loss. Full charge-transfer at the first and third pump stages can occur as early as time t1 if the E1 magnitude of the φ1 signal can produce a transient of at least 2Vt. (Similarly, full charge-transfer can occur under the same conditions as early as time t5 for the second and fourth pump stages.)

Cascading many pump stages can further elevate output potential at the last output node. The efficient charge transfer provided by the present invention allows a given output potential VPout to be reliably achieved with fewer pump stages and/or lower operating potential (e.g., phase signal amplitude). A number of sub-pump circuits may be combined in parallel to provide more load current at a given magnitude of output potential VPout. However so-doing dictates that charge (or current) be distributed substantially equally over the various clock phase time periods.

In a second aspect, a generator is provided to output the required non-overlapping phase clock signals to drive a sub-pump circuit, or a plurality of such circuits. In a preferred embodiment of a phase signal generator, a master clock signal BSCLK and its complement BSCLKB are input to first input leads of identical first and second NAND and inverter logic units. These logic units output first and second non-overlapping clock signals CLK and CLKB that have the frequency of BSCLK. CLK is input to the second input lead of the first logic unit, and also to the clock and inverted clock inputs for first and second D-type flip-flop units whose complementary output is fedback to the same flip-flop's D input. CLKB is input to the second input of the second logic unit, and also to the inverted clock and clock inputs for the first and second D-type flip-flops. The first and second flip-flops toggle on opposite transitions of the BSCLK signal. Thus each flip-flop outputs a 50% duty cycle having half the frequency of BSCLK, with a 90° phase shift between these two flip-flop output signals that is substantially independent of BSCLK frequency. The flip-flop output signals are input to respective first and second delay modules whose respective outputs are the desired four-phase non-overlapping clock signals that will drive sub-pump circuits. Within the first delay unit, the output from the first flip-flop is delayed to create a first phase clock signal φ1 that is inverted to create a second phase clock signal φ2. In similar fashion the second delay unit creates φ3 and φ4 phase clock signals. Each φ1, φ3, φ2, φ4 signal is a square wave of half the frequency of BSCLK, and is delayed 90° from an adjacent phase clock signal, independently of BSCLK frequency. Preferably pump circuits and a clock generator according to the present invention are fabricated on a common integrated circuit that may also include the memory array requiring the pump-generated high voltage, as well as associated address logic for the memory array.

Other features and advantages of the invention will appear from the following description in which the preferred embodiments have been set forth in detail, in conjunction with the accompanying drawings.

BRIEF DESCRIPTION OF THE DRAWINGS

FIG. 3A depicts a four-phase four-stage positive high voltage pump circuit, according to the prior art;

FIGS. 3B–3E depict exemplary non-overlapping four-phase pulse trains, such as used with the circuit of FIG. 3A;

FIG. 4A depicts a three-phase four-stage positive high voltage pump circuit, according to the present invention;

FIGS. 4B–4C depict exemplary non-overlapping three-phase clock pulse trains, suitable for driving the pump circuit of FIG. 4A, according to the present invention;

FIG. 5A depicts a sub-pump circuit comprising two pump stages, according to the present invention;

FIGS. 5B, 5C, 5D depict phase signals used to drive the sub-pump circuit of FIG. 5A, according to the present invention;

FIG. 7A is a detailed block diagram of a preferred embodiment of a clock generator unit that may be used with the pump system of FIG. 6, according to the present invention;

FIGS. 7B, 7C, 7D depict clock generator input BSφ clock signal, and clock generator output intermediate first and second clock phase-shifted clock signals Q1 and Q2, according to the present invention;

FIG. 8A is detailed block diagram of a preferred embodiment of a delay module that outputs phase clock signals for driving a pair of sub-pump circuits, according to the present invention;

FIGS. 8B, 8C, 8D, 8E depict phase clock signals generated by the delay module shown in FIG. 8A, according to the present invention.

DETAILED DESCRIPTION OF THE PREFERRED EMBODIMENTS

Figure 1:
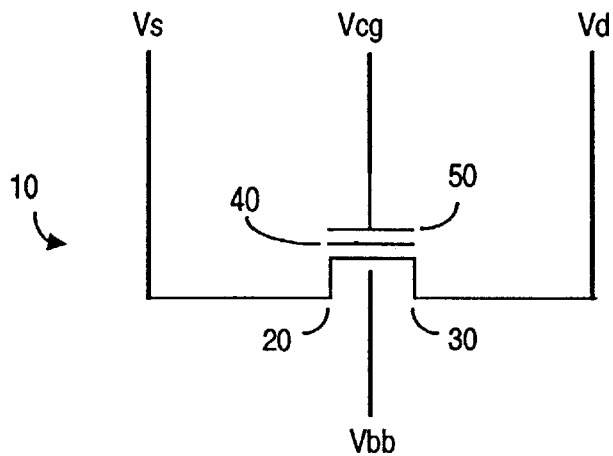
FIG. 1 depicts a conventional EPROM/EEPROM-type storage cell, according to the prior art.

FIG. 4A depicts a four-phase, four-stage positive voltage generator circuit 230, according to the present invention. With respect to FIG. 1, a positive high voltage pump circuit 130 may be implemented using circuit 230, or indeed a plurality of circuits 230 whose VPout output ports are coupled in parallel to sum load currents deliverable to Cload. A typical stage 240 in circuit 230 includes a charge transfer transistor, e.g., M1A, two diode-coupled Vt-cancelling transistors, e.g., M2A, M3A, and associated capacitors C1, C2, C3 (or C4), and drive clock signals $\phi1$, $\phi2$ (or $\phi4$), $\phi3$. The devices are each preferably native (e.g., low threshold voltage Vt) MOS devices that have a gate (or input lead) and interchangeable source and drains (or output leads).

FIGS. 4B–4E depict the four-phase non-overlapping clock signals used to drive circuit 230. The amplitude of the clock signals is E1 V, typically a magnitude determined by the Vcc power supply (not shown) used to power circuit 230 and its associated phase generator. Commonly E1 will have a value in the range of about 3.3 VDC to about 5.5 VDC, and may in fact be determined by a battery used to operate the various circuitry containing the present invention (as well as other circuitry on the same IC chip).

In contrast to prior art FIG. 3A, the embodiment of FIG. 4A adds a third transistor, e.g., M3A, to each stage, e.g., stage 240. As will now be described, the circuitry of FIG. 3A pre-boosts the charge on the gate node of the charge transfer transistor, e.g., M1A, with the $\phi1$ signal at setup time t1. Indeed, full charge transfer at the first and third pump stages can commence as early as time t1 if the E1 magnitude of the $\phi1$ pulse train produces a transient at node 1 and node 2 exceeding about 2 Vt, and as early as time t5 for the second and third pump stages. Gate potential of the charge transfer transistor is not source-limited but depends upon drain potential, which drain potential exceeds the source potential at times t1 and t5. Thus, gate potential is elevated when charge transfer begins, which turns-on the charge transfer transistor very hard. As a result, not only can charge transfer begin earlier in time than in prior art configurations, but a higher charge transfer efficiency is achieved. In FIG. 4A, all devices in circuit 230 preferable are native MOS transistors, and threshold voltage, Vt, will be relatively low, e.g., perhaps 0.2 VDC or less.

Referring to FIGS. 4B–4E, times t0, t1, t2, t3, t4, t5 may be separated from each other by a few ns or so. At time t0, $\phi4$ transitions 1-to-0, which AC-couples via capacitor C4 a negative voltage transient (whose magnitude approaches E1) to the gate of devices M1B, M1D in pump stages two and four. These gate potentials are depressed to within Vt of the associated source potentials, and M1B, M1D are turned-off. The off states of M1B, M1D will prevent backward charge flow (leftward direction charge flow, in FIG. 4A) when $\phi1$ transitions 0-to-1.

At setup time t1, $\phi3$ is high and the $\phi1$ 0-to-1 state change AC-couples through capacitors C1 to nodes 1 and 3. The potential at nodes 1 and 3 elevates by about E1 volts, raising the drain potential of charge transfer devices M1A and M1C, and gate potential of auxiliary device M2B. The $\phi1$ transient also elevates M1A, M1C gate potentials by about (E1-Vt) due to the diode-like presence of M3A, M3C. By contrast, on the prior art configuration of FIG. 3A, gate potential in the charge transfer devices was source-limited. Thus, as early as time t1, charge transfer devices M1A, M1C can begin to turn-on and transfer charge in stage one from node 1 to node 2, and in stage three from node 3 to node 4.

Indeed if the E1 magnitude of $\phi1$ is sufficiently large such that the AC-coupled transient seen at nodes 1 and 3 exceeds about 2Vt (e.g., Vt of M1A plus Vt of M2A) full charge transfer may begin at time t1 for the first and third pump stages, and at time t5 for the second and fourth pump stages. In practice, Vcc≈5 VDC should boost M1A gate potential sufficiently high to allow node 1 to node 2 charge transfer without Vt loss. Understandably, it is advantageous to boost M1A gate potential to reduce Vt loss and increase efficiency of charge transfer, especially for low Vcc conditions (e.g., Vcc≈3 VDC) and/or (inadvertently) high Vt MOS devices.

At time t2, the 1-to-0 transition of $\phi3$ AC couples through C2 to depress potential at nodes 2 and 4, which decreases gate potential of M2A, M2C, turning-off devices M2A, M2C. However gate potentials of M1A, M1C are unchanged. As the potential at source nodes 2 and 4 decreases, transfer devices M1A, M1C turn harder on, further enhancing charge transfer from node 1 to 2, and from node 3 to 4 that began as early as time t1. It will be appreciated that precharge of gate potential for a transfer device, e.g., M1A, occurs between time t1 (when $\phi1$ goes high) and time t2 (when $\phi3$ goes low), and that an interval time between t1 and t2 of a few ns is sufficient. Once transfer gate precharge is complete, it is unimportant whether $\phi3$ goes high before $\phi2$ goes high, or vice versa.

At time t3, $\phi2$ transitions 0-to-1, AC-coupling a positive-going transient through capacitors C3 into the gates of devices M1A, M1C. As a result, devices first and third pump stage transfer devices M1A, M1C are turned-on still harder, to provide even more efficient charge transfer from nodes 1 to 2, and from nodes 3 to 4.

At time t4, $\phi2$ transitions 1-to-0, AC-coupling a negative-going transient through capacitors C3 into the gates of M1A, M1C. Devices M1A, M1C turn-off, thus preventing any backward flow of charge (e.g., in a leftward direction in FIG. 4A) when $\phi3$ transitions 0-to-1 at time t5.

During the transitions at times t5, t6, t7, the above-described charge transfer continues, except charge is transferred from node 2 to node 3, and from node 4 to Vpout.

Thus, in reviewing the above description, it is seen that the circuit of FIG. 4A starts charge transfer as early as time t1 (and t5), as contrasted with time t3 for the prior art configuration of FIG. 3A. Further, when the charge transfer devices are turned-on, their gate potential is elevated higher than what is possible with the prior art configuration of FIG. 3A, which means the efficiency of charge transfer is enhanced, as well as its earlier onset in time.

In practice, Vcc ranging from perhaps 3 VDC to 5 VDC can be elevated to perhaps +10 VDC or so by circuit 230, depending upon current load demand and magnitude of Cload. Understandably, the ability to efficiently and quickly increase voltage with the present invention with little or no Vt voltage loss means VPout potential will be higher for a given number of stages 240, or that fewer stages 240 are required to implement circuit 230.

FIG. 5A depicts a preferred embodiment of a single sub-pump stage 250 that comprises two pump stages 240-1, 240-2, each of which preferably is similar to stage 240 in FIG. 4A. The AC-coupling capacitors preferably are implemented with MOS transistors M30 (for C1), M20 (for C2) and M10 (for C1), with node 1 coupled to the Vcc node for the circuit. Of course the coupling capacitors could be implemented other than by using MOS devices. For example, discrete capacitors may be used.

FIGS. 5B, 5C, 5D depict the various non-overlapping clock signals, here designated as $\phi 1$, $\phi 1A$, and $\phi 1B$. (Note that a fourth phase, associated with node 1, is Vcc, or a steady-state DC potential.) Ideally, the potential at node 2 will be E1 (e.g., the magnitude of the AC-transient from a clock signal) volts greater than Vcc, and the potential at node 3 will ideally be Vcc+1E1. Of course the precise node 3 magnitude will be dependent upon the magnitude of the load, which is to say the load current to be delivered from stage 240-2.

Figure 6:
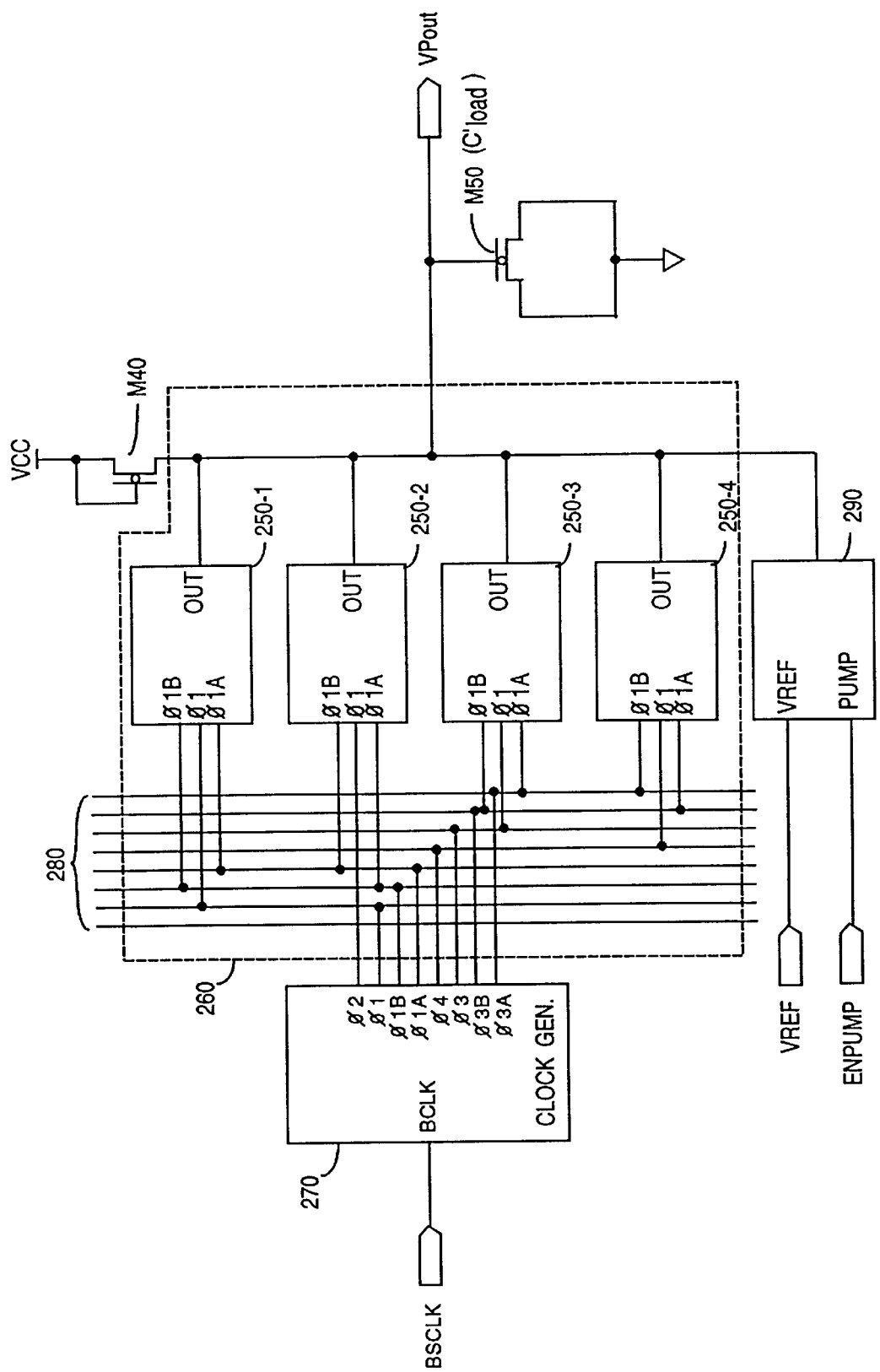
FIG. 6 depicts a preferred embodiment of a pump system comprising four sub-pumps, a clock generator unit and a voltage regulator unit, according to the present invention.

FIG. 6 depicts a preferred embodiment of a pump system 260, as well as a clock generator unit 270, bus interconnect leads 280, and a voltage regulator unit 290. Clock generator unit 270 has a role similar to phase generator 150 in FIG. 2, and outputs the various non-overlapping phase clock signals used to drive the various sub-pump stages 250-1, 250-2, 250-3, and 250-4 shown in this embodiment.

In the embodiment of FIG. 6, system 260 includes four parallel-coupled sub-pump stages 250-1, 250-2, 250-4, 250-4, in which each sub-pump stage 250-N is preferably similar to pump stage 250, shown in FIG. 5A. It will be appreciated that parallel-coupling the output nodes of each sub-pump stage will permit system 260 to deliver approximately four times the load current to the load (here shown as C'load) than could be delivered by a single sub-pump.

A master clock signal BSCLK is provided as input to clock generator unit 150'. Preferably the frequency of BS$\phi$ is twice the frequency (or repetition rate) of a phase clock signal, and preferably has 50% duty cycle. Thus, if the repetition rate of the phase clock signals, e.g., $\phi 1B$ is to be 10 MHz, then the frequency of BSCLK shall be a 20 MHz square wave. Voltage regulator unit 290 is enabled by an ENPUMP logic signal. Unit 290 receives a VREF input reference voltage and clamps VPout to a voltage level determined by unit 280, +8 VDC, for example.

Figures 7E, 7F, 7G, 7H:
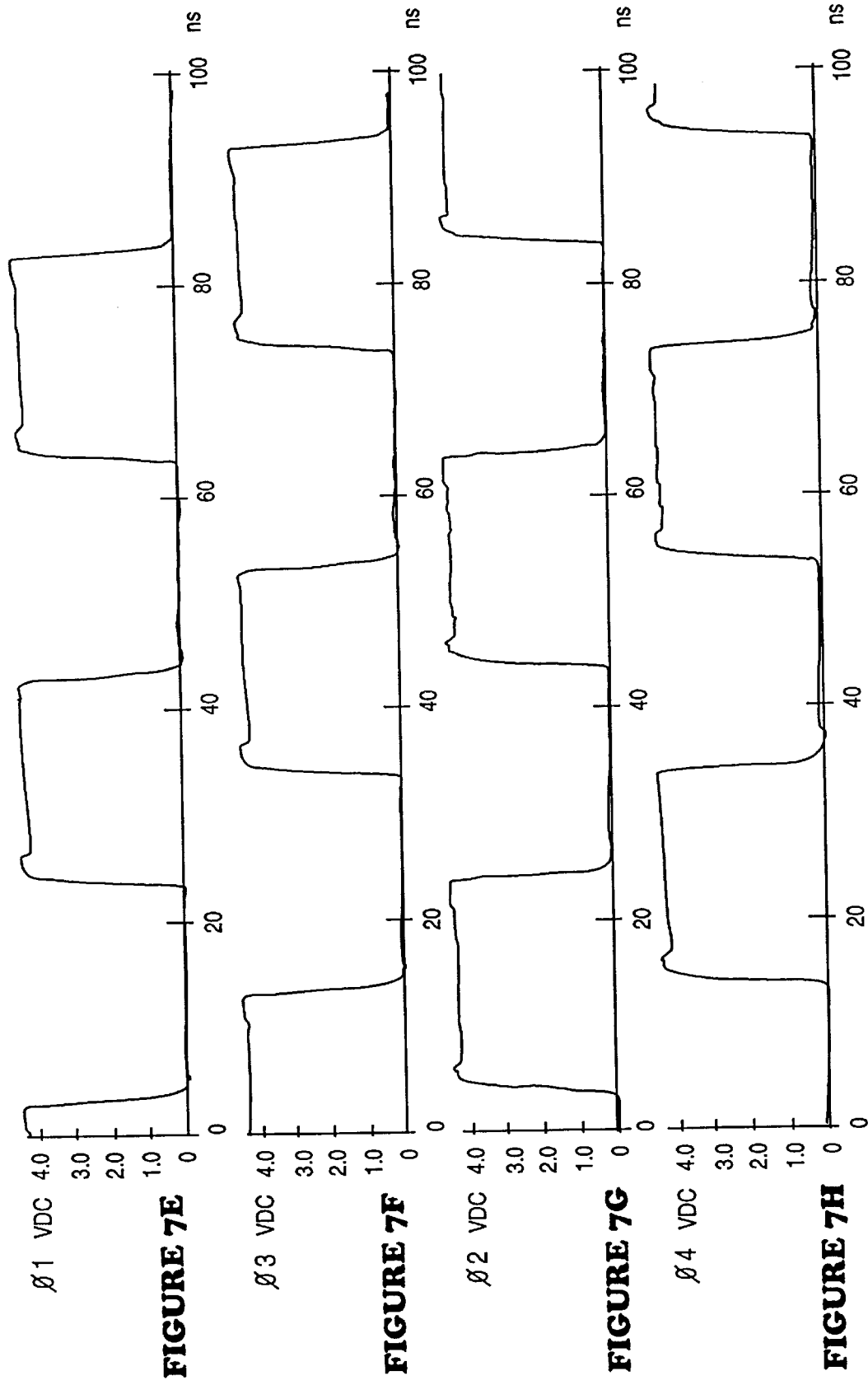
FIGS. 7E, 7F, 7G, 7H depict non-overlapping phase clock signals provided by the clock generator unit of FIG. 7A, according to the present invention.

Details of clock generator unit 270 will now be described shortly with respect to FIG. 7A. The BSCLK master clock signal and its complement are coupled as input to first and second logic units 300-1, 300-2 that preferably comprise two-input NOR gates whose outputs are coupled to a pair of inverters. The output of the inverter pairs are first and second non-overlapping clock signals, denoted CLK and CLKB that are the same frequency as BSCLK.

The complementary CLK, CLKB signals are input as clock signals to first and second preferably D-type flip-flop units 310-1, 310-2. The complementary or QB output of each flip-flop is fedback to the same flip-flop's D input. Note from FIG. 7A that the CLKB signal from first logic unit 300-1 is coupled to the CKB (e.g., complementary) clock input of the first D flip-flop 310-1, to the CK input of the second flip-flop 310-2, and also is fedback to one input of the second logic unit 300-2. In similar fashion, the CLK signal from the second logic unit is coupled to the CK input of the first flip-flop, to the CKB input of the second flip-flop, and is fedback as an input to the first logic unit 300-1. In practice each inverter or other logic gate will contribute a time delay of perhaps 0.2 ns. However, with BSCLK operating at perhaps 20 MHz, the per-gate delay is negligible. There will be 180° phase difference between clock inputs CLKB, CLK to the first and second flip-flops 310-1, 310-2. Thus, first flip-flop output Q1 will toggle at the rising edge of BSCLK (see FIGS. 7B, 7C), while second flip-flop output Q2 will toggle at the falling edge of BSCLK (see FIGS. 7B, 7D). As seen in FIGS. 7B, 7C, 7D, the result is that Q1 and Q2 each have 50% duty cycle and a frequency half that of BSCLK. Further, Q1 and Q2 are phase shifted one from the other by a constant 90°. It will be appreciated from circuit 270 that the phase shift between Q1 and Q2 is substantially independent of the frequency of BSCLK, especially where signals Q1 and Q2 are in the 10 MHz to 20 MHz range.

Having generated phase-shifted signals Q1 and Q2, it will be appreciated that four phase-delayed signals may be generated from these signals. Circuit 270 further includes first and second delay modules 320-1, 320-2, coupled respectively to receive as an input Q1 from flip-flop 310-1 and Q2 from flip-flop 310-2.

It is the function of delay modules 320-1, 320-2 to generate first and second sets of non-overlapping clock signals with 180° phase shift between the sets. The first set of clock signals will be denoted $\phi 1$, $\phi 1B$, and $\phi 1A$, while the second set of clock signals will be denoted $\phi 2$, $\phi 2A$, and $\phi 2B$. Signal $\phi 1A$ is identical to signal $\phi 2B$, and signal $\phi 1B$ is identical to signal $\phi 2A$. These various phase clock signals are then coupled to the various sub-pump circuits 250-1, 250-2, 250-3, 250-4 as shown in FIG. 6. Other techniques to generate the various phase clock signals from phase-delayed Q1 and Q2 may also be used.

Within delay module 320-1, Q1 is delayed an amount $\Delta t$ to create $\phi 1$. The $\phi 1$ signal is inverted to create $\phi 2$. Within delay module 320-2, Q2 is delayed an amount $\Delta t$ to create $\phi 3$, and $\phi 3$ is inverted to create $\phi 4$. FIGS. 7E, 7F, 7G, and 7H depict waveforms $\phi 1$, $\phi 3$, $\phi 2$, $\phi 4$ for a clock frequency of about 25 MHz.

It is seen that each of the signals in FIGS. 7E–7H has 50% duty cycle and a common base frequency, e.g., about 25 MHz, and a 90° phase shift from an adjacent signal. Advantageously, the constant phase shift will remain even if the base frequency changes. As a result, the various phase clock signals remain in relative phase shift to each other, as contrasted to prior art clock generation techniques. As a consequence, pump circuits and sub-pump circuits driven by these phase clock signals will operate reliably despite master clock frequency variations. This reliability promotes good current sharing between sequentially operated parallel-coupled pump circuits, and good pump action within individual pump circuits.

The ability of circuit 270 to generate two intermediate clock signals Q1 and Q2 having a fixed 90° phase lag independent of clock frequency is in contrast to prior art clock generation techniques. In such techniques, signal Q1 would typically be generated, and signal Q2 would be generated by inputting Q1 to a fixed time delay element whose output was Q2, phase shifted by 90°, but only at a specific operating frequency. In such prior art approaches, drift or change in operating frequency would not produce a compensating change in the fixed time delay element, with the result that the phase shift between intermediate clock signals would vary with frequency. Unfortunately, such variation would cause some pump circuits to transfer charge too early or too late, with resultant inefficiency and poor distribution of current loading among a plurality of pump circuits whose outputs were parallel-coupled.

FIG. 8A is a detailed block diagram of a preferred embodiment of a delay module 340 outputting phase clock signals for driving a pair of sub-pump circuits. Similarly to delay module 320-1 or 320-2 (see FIG. 7A), delay unit 340 receives intermediate clock signal Q1 as its input. More particularly, the Q1 signal passes through inverter pair 350 and is input to first delay unit 360-1 and to logic unit 400. Delay unit 360-1 imposes a small time delay (e.g., 2 ns to 3 ns or so) and the delayed Q1 signal is input to inverter pair 370-1. The node N1 output of this inverter pair is a first intermediately delayed signal that is input to a series-coupled inverter triplet 380, as input to the second delay unit 360-2, and as input to a series-coupled inverter pair 390. The output of inverter triplet 380 is the phase clock signal φ2 (shown in FIG. 8C), and the output of inverter pair 390 is phase clock signal φ1 (shown in FIG. 8B. Because φ2 passes through one more inverter stage than φ1 (e.g., three inverters in unit 380 versus two inverters in unit 390) φ2 will be the complement of φ1 and will be very slightly delayed in phase.

Delay unit 360-2 imposes a small time delay on the node N1 signal (e.g., 2 ns to 3 ns or so), and the thus-delayed signal is passed through a series-coupled inverter pair 370-2 whose output signal is denoted as node N2, and is a second intermediately delayed signal. The node N2 signal represent one input to logic unit 400, the other input being the signal at node N3, which is to say the input signal to first delay unit 360-1. Logic unit 400 includes NAND-NOR and inverter components and outputs phase clock signals φ1B (see FIG. 8E) and φ1A (see FIG. 8D). The four output phase signals φ1, φ2, φ1A, φ1B may then be used as clock drive signals for two sets of sub-pumps, according to the present invention.

Advantageously, the configuration of FIG. 8A can provide four phase-shifted clock signals from a single intermediate flip-flop generated clock signal Q. The relative phase shifts between the four clock signals are substantially independent of the frequency of the clock signal Q, in contrast to prior art clock generation approaches. As a result, sub-pump circuits driven by a clock or phase generator according to the present invention will operate sequentially more reliably than is the case for prior art clock and pump systems. Because the relative phase clock delays are substantially constant, current sharing among multiple pump circuits whose outputs are parallel-combined is more reliable. As a result, a minimum magnitude of the elevated pump circuit output voltage is reliably generated, which promotes reliability of accessing information in storage cells whose programming potential is derived from such pump circuits.

Figure 2:
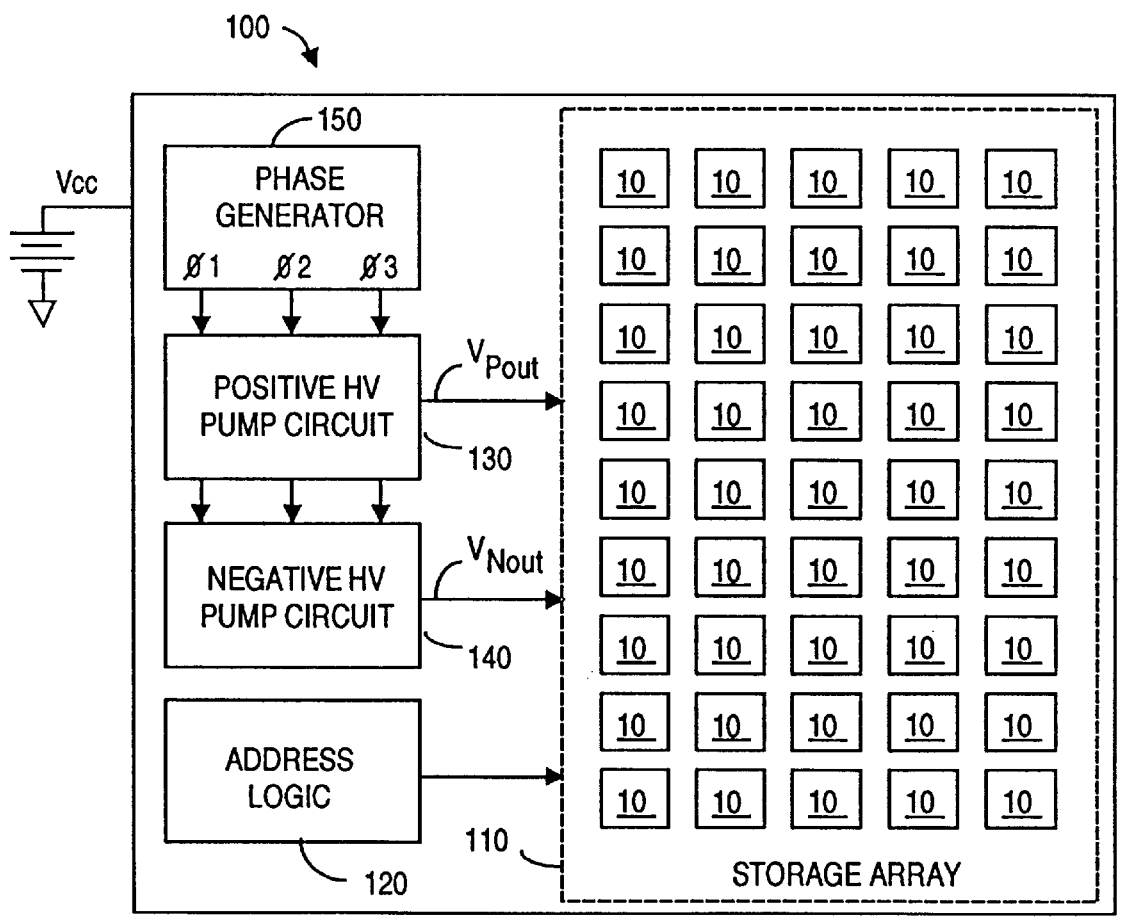
FIG. 2 depicts an IC including positive and negative high voltage pump circuits, a multi-phase generator, and an array of storage cells, according to the prior art.

Although the present invention has been described with respect to four sub-pump units and clock signals therefor, the present invention may be expanded to a greater number of sub-pump units and clocks. For example, increasing the frequency of BSφ by a factor of four, and providing four additional D-type flip-flops would permit driving eight sub-pump units, according to the present invention. Referring to FIG. 2, it will be appreciated that phase generator 150 therein may be replaced with a phase or clock generator such as generator 270 (FIG. 6 and FIG. 7A, and that the positive high voltage pump circuit 130 in FIG. 2 may be replaced with a pump circuit 230 (FIG. 4A) or circuit 250 (FIG. 5A). As a result, a phase or clock generator and/or pump circuitry according to the present invention may be implemented on a common integrated circuit with the storage array requiring VPout from the pump circuitry, and with the associated address logic circuitry.

Modifications and variations may be made to the disclosed embodiments without departing from the subject and spirit of the invention as defined by the following claims.

What is claimed is:

1. A charge pump system operable from a potential of magnitude Vcc and generating and providing at an output node of said system a positive voltage whose magnitude exceeds said Vcc potential, comprising:

at least one charge pump stage having an input node at a first potential and having said output node, said charge pump stare including:

a charge transfer device having a drain lead coupled to said input node, and having a source lead coupled to said output node, said charge transfer device also having a gate lead;

a circuit, coupled to said charge transfer device, that at a time t1 pre-boosts a potential at said gate lead of said charge transfer device wherein a potential at said source lead does not substantially limit said pre-boosting of said potential at said gate lead, said circuit at a subsequent time t2 decreasing said potential at said source lead of said charge transfer device;

said circuit, subsequent to said time t2, further boosting turn-on potential between said gate lead of said charge transfer device and said output node;

wherein said potential at said gate lead of said charge transfer device reaches at least a turn-on potential of said charge transfer device at time t1 and said charge transfer device is fully turned-on by time t2 and charge present at said input node transfers to said output node and elevates a potential at said output node to a magnitude exceeding said first potential at said input node;

wherein upon coupling said charge pump system to a generator outputting at least a first clock phase signal (φ1), a second clock phase signal (φ2), and a third clock phase signal (φ3), wherein each of said φ1, φ2 and φ3 is non-overlapping relative to each other, said circuit causes at least one of the following events to occur:

at said time t1, at least a portion of a positive transition of said φ1 is AC-coupled to and precharges said gate lead of said charge transfer device, wherein said charge transfer device at least begins to turn-on; and at said time t2, at least a portion of a negative transition of said φ3 is AC-coupled to said source lead of said charge transfer device, wherein said charge transfer device is turned more fully on.

2. A charge pump system operable from a potential of magnitude Vcc and generating and providing at an output node of said system a positive voltage whose magnitude exceeds said Vcc potential, comprising:

at least one charge Pump stage having an input node at a first potential and having said output node, said charge pump stage including:

a charge transfer device having a drain lead coupled to said input node, and having a source lead coupled to said output node, said charge transfer device also having a gate lead;

a circuit, coupled to said charge transfer device, that at a time t1 pre-boosts a potential at said gate lead of said charge transfer device wherein a potential at said source lead does not substantially limit said pre-boosting of said potential at said gate lead, said circuit at a subsequent time t2 decreasing said potential at said source lead of said charge transfer device;

said circuit, subsequent to said time t2, further boosting turn-on potential between said gate lead of said charge transfer device and said output node;

wherein said potential at said gate lead of said charge transfer device reaches at least a turn-on potential of said charge transfer device at time t1 and said charge transfer device is fully turned-on by time t2 and charge present at said input node transfers to said output node and elevates a potential at said output node to a magnitude exceeding said first potential at said input node;

wherein upon coupling said charge pump system to a generator of a first clock phase signal ($\phi 1$), a second clock phase signal ($\phi 2$) and a third clock phase signal ($\phi 3$), wherein each of said $\phi 1$, $\phi 2$ and $\phi 3$ is non-overlapping relative to each other:

at a time t0 preceding said time t1, said output node is decoupled from a subsequent charge pump stage;

at said time t1, at least a portion of a positive transition of said $\phi 1$ is AC-coupled to and precharges said gate lead of said charge transfer device, and a greater fraction of said positive transition of said $\phi 1$ is AC-coupled to said input node;

at said time t2, at least a portion of a negative transition of said $\phi 3$ is AC-coupled to said source lead of said charge transfer device; and at time t3 subsequent to said time t2, at least a portion of a positive transition of said $\phi 2$ is coupled to said gate lead of said charge transfer device, wherein said charge transfer device is turned more fully on.

3. A charge pump system operable from a potential of magnitude Vcc and generating and Providing at an output node of said system a positive voltage whose magnitude exceeds said Vcc potential, comprising:

at least one charge pump stage having an input node at a first potential and having said output node, said charge pump stage including:

a charge transfer device having a drain lead coupled to said input node, and having a source lead coupled to said output node, said charge transfer device also having a gate lead;

a circuit, coupled to said charge transfer device, that at a time t1 pre-boosts a potential at said gate lead of said charge transfer device wherein a potential at said source lead does not substantially limit said pre-boosting of said potential at said gate lead, said circuit at a subsequent time t2 decreasing said potential at said source lead of said charge transfer device;

said circuit comprising:

a first auxiliary device and a second auxiliary device, each said auxiliary device having a gate lead, a source lead, and a drain lead; wherein:

said source lead of each said auxiliary device is coupled together and to said input node;

said drain lead of each said auxiliary device is coupled together and to said input lead of said charge transfer device;

said gate lead of said first auxiliary device is coupled to said input node; and said gate lead of said second auxiliary device is coupled to said output node;

wherein said potential at said gate lead of said charge transfer device reaches at least a turn-on potential of said charge transfer device at time t1 and said charge transfer device is fully turned-on by time t2 and charge present at said input node transfers to said output node and elevates a potential at said output node to a magnitude exceeding said first potential at said input node.

4. The charge pump system of claim 3, wherein at least one of said charge transfer device, said first auxiliary device, and said second auxiliary device is a native MOS device.

5. A charge pump system operable from a potential of magnitude Vcc and generating and providing at an output node of said system a positive voltage whose magnitude exceeds said Vcc potential, comprising:

at least one charge pump stage having an input node at a first potential and having said output node, said charge pump stage including:

a charge transfer device having a drain lead coupled to said input node, and having a source lead coupled to said output node, said charge transfer device also having a gate lead;

a circuit, coupled to said charge transfer device, that at a time t1 pre-boosts a potential at said gate lead of said charge transfer device wherein a potential at said source lead does not substantially limit said pre-boosting of said potential at said gate lead, said circuit at a subsequent time t2 decreasing said potential at said source lead of said charge transfer device;

said circuit, subsequent to said time t2, further boosting turn-on potential between said gate lead of said charge transfer device and said output node;

wherein said potential at said gate lead of said charge transfer device reaches at least a turn-on potential of said charge transfer device at time t1 and said charge transfer device is fully turned-on by time t2 and charge present at said input node transfers to said output node and elevates a potential at said output node to a magnitude exceeding said first potential at said input node;

a signal generator, operable from a source of said Vcc, that outputs at least a first clock phase signal ($\phi 1$), a second clock phase signal ($\phi 2$), and a third clock phase signal ($\phi 3$), wherein each of said $\phi 1$, $\phi 2$ and $\phi 3$ is non-overlapping relative to each other and has a common frequency;

wherein:

at said time t1, $\phi 1$ transitions in state from low-to-high and at least a fraction of a resultant positive transition is AC-coupled to said gate lead of said charge transfer device, and a greater fraction of said positive transition is AC-coupled to said input node;

at said time t2, $\phi 3$ transitions in state from high-to-low and at least a fraction of a resultant negative transition is AC-coupled to said source lead of said charge transfer device, wherein said charge transfer device is turned more fully on; and at time t3 subsequent to said time t2, $\phi 2$ transitions in state from low-to-high and at least a fraction of a resultant positive transition is AC-coupled to said gate lead of said charge transfer device, wherein said charge transfer device is turned even more fully on.

6. The charge pump system of claim 5, wherein:

at least one of $\phi 1$, $\phi 2$, and $\phi 3$ has a low-to-high state voltage differential approximating said Vcc; and potential at said output node is elevated by a magnitude proportional to said Vcc.

7. The charge pump system of claim 5, wherein said signal generator outputs $\phi 1$, $\phi 2$, and $\phi 3$ such that a phase difference between each phase signal is substantially independent of said common frequency.

8. The charge pump system of claim 5, wherein said charge pump system and said signal generator are fabricated on an integrated circuit.

9. The charge pump system of claim 5, further including a first capacitor (C1) coupled between said signal generator and said input node, a second capacitor (C2) coupled between said signal generator and said output node, and a third capacitor (C3) coupled between said signal generator and said gate lead of said charge transfer device.

10. The charge pump system of claim 9, wherein at least one of C1, C2, C3 is selected from a group consisting of (i) a capacitor implemented as a MOS device having a source, a drain, and a gate wherein said source and drain are coupled together to form a first capacitor lead and said gate forms a second capacitor lead; and (ii) a discrete capacitor.

11. The charge pump system of claim 5, wherein said signal generator includes:

an input port receiving a master clock signal (BSφ) whose frequency is twice said common frequency;

a first logic unit that includes a two-input NOR gate having a first input to which said signal BSφ is coupled, said NOR gate outputting a first gate signal (φB) having said common frequency;

a first D-type flip-flop having an inverted-clock input (CKB) port coupled to an output of said NOR gate, having a clock input (CK) port coupled to a second input of said NOR gate, having a D input port coupled to a complementary output signal (QB) port of said first D-type flip-flop, and having an output signal (Q) port outputting a first intermediate signal (Q1);

wherein Q1 has a 50% duty cycle, has said common frequency, and changes state on a positive-going transition of said BSφ signal; and delay-logic circuit coupled to receive Q1 and to generate therefrom said φ1, φ2, and φ3.

* * * * *